United States Patent [19]

Dennard et al.

[11] 4,035,198

[45] July 12, 1977

[54] METHOD OF FABRICATING FIELD EFFECT TRANSISTORS HAVING SELF-REGISTERING ELECTRICAL CONNECTIONS BETWEEN GATE ELECTRODES AND METALLIC INTERCONNECTION LINES, AND FABRICATION OF INTEGRATED CIRCUITS CONTAINING THE TRANSISTORS

[75] Inventors: Robert Heath Dennard, Croton-on-Hudson; Vincent Leo Rideout, Mohegan Lake, both of N.Y.

[73] Assignee: International Business Machines Corporation, Armonk, N.Y.

[21] Appl. No.: 701,442

[22] Filed: June 30, 1976

[51] Int. Cl.$^2$ .................................... H01L 21/265
[52] U.S. Cl. ............................. 148/1.5; 148/175; 148/187
[58] Field of Search .................... 148/1.5, 175, 187

[56] References Cited

U.S. PATENT DOCUMENTS 3,899,363  8/1975  Dennard et al. .................... 148/1.5

OTHER PUBLICATIONS

Kalter et al., "Self-Aligning Metal to Polysilicon Contacts," IBM Tech. Discl. Bull., vol. 14, No. 10, Mar. 1972, p. 3176.

Rideout, "Masking for One-Device Cell Memories Using Self-Registering Metal-to-Polysilicon Contacts," IBM T.D. B., vol. 17, No. 9, 2/1975, pp. 2802-2804.

*Primary Examiner*—L. Dewayne Rutledge
*Assistant Examiner*—J. M. Davis
*Attorney, Agent, or Firm*—John J. Goodwin

[57] ABSTRACT

A method of fabricating a field effect transistor (FET) wherein a self-registered or misregistration tolerant electrical connection is provided between the gate electrode and a metallic interconnection line. The method involves a unique structure which includes a thick deposited oxide insulation layer and an etch stopping layer over doped silicon source and drain regions, over polysilicon gate electrode regions, and over field isolation regions. The etch stopping layer facilitates fabrication of a self-registering electrical connection between the gate electrode and a metallic interconnection line wherever desired. The thick deposited oxide layer provides reduced capacitive coupling between the insulated regions and the metallic interconnection line when compared to known self-registered gate contacting methods that employ only thermally grown oxide insulation. The method also includes the provision for controlling the removal of insulation over the gate electrode wherever desired without seriously degrading the insulation over other parts of the structure. The disclosed method further relates to fabricating an integrated circuit containing FETs having a self-registered electrical connection between the gate electrode and the metallic interconnection line, the gate electrode self-aligned with respect to the source and drain regions, and wherein FETs of the integrated circuit have: a channel region; a gate insulator; an electrically conductive gate electrode; source and drain regions; thick insulation over the source and drain and over the gate electrode except in the contact areas; field isolation or field shield regions between FETs of the integrated circuit; metallic-type high electrical conductivity interconnection line; and self-registering electrical connection between the gate and the interconnection line.

25 Claims, 21 Drawing Figures

METHOD OF FABRICATING FIELD EFFECT TRANSISTORS HAVING SELF-REGISTERING ELECTRICAL CONNECTIONS BETWEEN GATE ELECTRODES AND METALLIC INTERCONNECTION LINES, AND FABRICATION OF INTEGRATED CIRCUITS CONTAINING THE TRANSISTORS

BACKGROUND OF THE INVENTION

1. Field of the Invention

The present invention relates generally to field effect transistors (FETs) and to the preparation of integrated circuits containing a plurality of the FETs. More particularly the present invention is related to a novel FET having a gate electrode which, wherever desired, makes a self-registering or misregistration tolerant electrical connection to a metallic high-electrical conductivity interconnection line. Furthermore, the present invention provides FETs which have a thick chemically vapor deposited insulation over the diffused source and drain regions, over gate electrode regions, and over the field isolation regions to significantly reduce the coupling capacitance between the interconnection line and the insulated regions.

2. Description of the Prior Art

It is well known in the prior art that the FET is an important electrical switching and amplifying device used in large scale integrated circuits. Such integrated circuits can contain tens or even hundreds of thousands of FETs on a single semiconductor chip which measures about one quarter of one inch on a side. The area devoted to each FET and the ease of electrically interconnecting a plurality of FETs are important factors in determining the device packing density on the chip. The electrical time constants of the integrated circuit are in part determined by the switching speed of the transistor, and by the resistance-times-capacitance (RC) time constant of the interconnection lines. Consequently, reduction of the capacitance between the interconnection line and the semiconductive substrate is an important requirement in integrated circuits.

Furthermore, in integrated circuits, electrical interconnection lines must frequently cross over or under other electrical signal lines and be insulated from them. The capacitance between such lines undesirably cross couples signals from one line to another and thereby increases the electrical noise on the signal lines. Consequently, reduction of the coupling capacitance between interconnection lines and other signal lines is an important requirement in integrated circuits.

The method employed to fabricate the integrated circuit determines both the area of the device and the electrical properties, i.e., the resistance and the capacitance, of the interconnection lines. Therefore, it is desirable to simultaneously reduce both the device size and the interconnection line capacitance. The material employed for the gate electrode of the FET influences the properties of the FET and the procedure for fabricating the FET. The most common gate materials used in the prior art are aluminum (a low-melting temperature metal), polysilicon (i.e. polycrystalline silicon — a high-melting temperature nonmetal), and tungsten and molybdenum (high melting temperature metals). The present invention relates generally to FETs wherein the gate electrode material is a high temperature material such as polysilicon or tungsten and wherein the gate material can be covered with a chemically vapor deposited insulator without seriously degrading the properties of the gate material.

With high melting temperature gate materials, it is relatively easy to fabricate doped silicon source and drain regions self-aligned with respect to the edges of the gate electrode. In the self-aligned gate technique, which is known in the art, the gate electrode is delineated prior to forming the source and drain regions. Consequently, the edges of the gate material determine the boundaries of the diffused or ion implanted source and drain regions. For example, a method of fabrication for ion implanted source and drain regions self-aligned to a polysilicon gate is described in "Design of Ion-Implanted MOSFET's with Very Small Physical Dimensions" by R. H. Dennard et al., IEEE J. Solid-State Circuits, Vol. SC-9, pp. 256–268, October 1974.

Of the various high melting temperature gate materials described hereinabove, polysilicon is by far the most popular for commercially fabricated integrated circuits for several reasons. Polysilicon can withstand high processing temperatures without degradation while other high melting temperature materials such as the metals tungsten and molybdenum tend to become unstable during exposure to high processing temperatures, particularly in the presence of oxygen. Furthermore, polysilicon offers potentially higher gate oxide reliability than other gate materials.

Yet another attractive feature of polysilicon is that it may serve not only as a gate electrode material, but as an interconnection line material as well. Thus an integrated circuit may be constructed of polysilicon gate FETs and interconnection lines of doped silicon, doped polysilicon, and/or metal. In terms of sheet resistance, at best silicon and polysilicon lines are degenerately doped and at the best have sheet resistances many orders of magnitude higher than that of metals such as aluminum. Doped silicon and doped polysilicon lines have about the same sheet resistances, but doped silicon lines generally have higher sheet capacitance because they are imbedded in the silicon substrate rather than electrically insulated from it by the field oxide isolation layer. Metal lines are also insulated from the semiconductive substrate by the field isolation layer. Consequently, doped silicon lines offer the largest, polysilicon lines smaller, and metal lines favorably much smaller RC time constants. Thus, it is generally desirable to construct an integrated circuit array of metal and polysilicon interconnection lines whenever possible. At intersection points these lines may either cross over each other, or be electrically connected together.

As discussed hereinabove, polysilicon may be used to provide gate electrode, interconnection line patterns, or both. One of the most vexing problems associated with the polysilicon gate FET technology is the means for providing electrical connection between the polysilicon material and the high-electrical conductivity, metallic, interconnection line material. In the prior art, a common means for providing electrical connection has been to photolithographically delineate and then define by etching a small hole or via through the insulator over the gate material. Because of diffraction effects, this hole cannot be made equal in diameter to the minimum exposable lithographic linewidth, but must be larger. Furthermore, because of mask to mask misregistration inherent in any lithographic exposure system, the area of the gate material beneath the via and the area of the interconnection material above the via must be enlarged to provide a tolerance for misregistration and for area modification due to etching and possible overexposure of the photoresist material. The result of all of the above considerations is that the area devoted to the polysilicon contact is relatively very large, in fact, it may even be significantly larger than the area of the channel region of the FET itself.

No prior art methods of providing a self-registering or misregistration tolerant electrical connection between the gate electrode and the metallic interconnection line are discussed by Kalter et al in IBM Technical Disclosure Bulletin, Vol. 14, No. 10, p. 3176, March 1972, and by Rideout in IBM Technical Disclosure Bulletin, Vol. 17, No. 9, p. 2802, February 1975. In these prior art methods, the insulation over the source and drain regions is provided by thermal oxidation of the semiconductor substrate, a portion of the substrate material being converted to an insulating oxide. Oxidation over the polysilicon gate is prevented by an oxidation barrier and gate masking layer. When the oxidation barrier layer is removed, the entire gate area is revealed for contacting. A metal interconnection line such as aluminum that crosses the revealed polysilicon gate will provide an electrical connection to that gate. Because the entire polysilicon area is revealed, the metal line and the polysilicon areas advantageously do not need to be precisely registered with respect to each other in order to make electrical connection. Much more precise registration is required, however, when the metal line must contact the polysilicon gate via a conventional contact hole etched through an oxide layer that exists over the gate.

Two restrictions apply to the oxidation barrier method for fabricating self-registered gate contacts as described by Kalter et al and by Rideout. First, the thickness of the thermally grown oxide is limited by the amount of substrate material that allowably can be converted to oxide, and by the allowable high temperature treatment time during which doped silicon regions such as source and drain regions, channel regions, and doped channel-stopper field regions diffuse and expand. Second, since the entire polysilicon area is revealed for contacting, wherever a metal line and a polysilicon region cross they will make electrical connection. Thus, it will not be possible to use the polysilicon as an additional level of interconnection without resorting to the use of at least one additional photolithographic masking step.

The present invention does involve an additional photolithographic masking step but is distinct in that rather than using only thermally grown oxide insulation, an etching stopping layer is included which allows the use of a thick deposited oxide insulation layer which provides much lower processing temperatures and relatively thicker insulation layers. Another distinction of the present invention over the prior art is that the FETs fabricated by the present method may be interconnected to form an integrated circuit wherein the metallic interconnection lines have relatively low capacitive coupling to the doped silicon regions, polysilicon lines, and substrate regions over which they cross without making electrical connection due to the presence of the relatively thicker, deposited oxide, isolation layer. Yet another distinction of the present invention is that the polysilicon gate electrode material may be used as an interconnection line material and may cross under metallic interconnection lines without making electrical connection to them, wherever desired.

SUMMARY OF THE INVENTION

An object of the present invention is to provide a method for fabricating a field effect transistor (FET) having a self-registering or misregistration tolerant electrical connection between the gate electrode and a metallic high-electrical conductivity interconnection line, and wherein the source and drain regions are self-aligned with respect to the gate electrode, and to a method for fabricating a semiconductor integrated circuit comprising a semiconductive substrate having at least one such transistor formed therein. In an integrated circuit, the FET generally acts as a switch to allow or prevent electrical signals from being conducted or as an amplifier to magnify weaker signals. Each FET has source, drain, and channel regions. Electrical connections can be made to source, drain, gate, and substrate regions for the purpose of applying or obtaining electrical signals. Furthermore, the diffused source and drain regions and the gate electrode regions can be laterally extended to provide electrical interconnection line patterns in addition to that provided by a metallic high-electrical conductivity interconnection line pattern. The metallic interconnection lines can cross the doped silicon source and drain regions and the polysilicon gate electrode regions with a minimum of capacitive cross coupling and without making electrical connection to those regions.

A further object of the present invention is to provide an integrated circuit containing a plurality of the FETs described hereinabove. The FETs of the present invention can be used to form an integrated circuit such as a microprocessor, and to form the logic, memory, addressing, decoding, sensing, and clocking circuits on the same integrated circuit chip and with the same fabrication process.

Still another object of the present invention is to provide for fabricating FETs with the gate electrode self-aligned with respect to the source and drain regions.

The foregoing and other objects, features and advantages of the invention will be apparent from the following more particular description of a preferred embodiment of the invention, as illustrated in the accompanying drawings.

DESCRIPTION OF THE PREFERRED EMBODIMENTS

Figure 1:
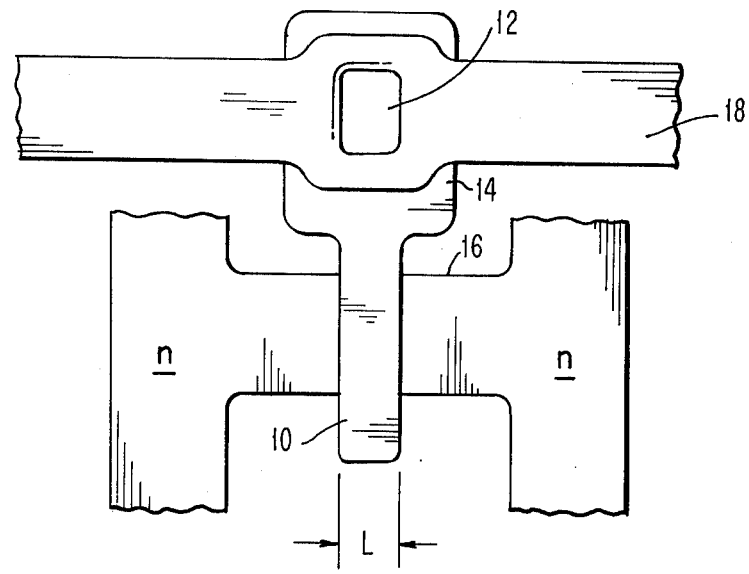
FIG. 1 illustrates a top view of a prior art FET with a polysilicon gate and a conventional contact hole to the polysilicon gate electrode made at the side of the channel region.

With the method of the present invention, any known field isolation technique such as oxide isolation or a field shield may be used to electrically isolate one FET from other FETs which are present on the same semiconductive substrate. The fabrication method to be described hereinbelow provides an embodiment of an FET which is surrounded by a relatively thick oxide isolation region, commonly referred to as the field oxide. This field oxide is generally formed by thermal oxidation of the semiconductive substrate, although it can also be formed by chemical vapor deposition. The field oxide may be fully or partially recessed into the semiconductive substrate with respect to the upper surface of the source and drain regions, or it may exist nonrecessed with respect to the source and drain regions.

The gate electrode of the FET is of a high melting temperature material, preferably polysilicon, and is generally doped to the same conductive type as the source and drain regions. According to the present invention, the self-registered contact hole to the polysilicon region is fabricated by delineating a via hole, which may be oversized (rather than the usual undersized approach) relative to the area of the polysilicon region. The via to the polysilicon material is etched through a chemically vapor deposited insulation layer. The etching depth is controlled by an etch stopping layer beneath the deposited insulation layer. Because of the nature of the etch controlling technique, the contact area may extend beyond the polysilicon region in either direction, and may even exceed the gate electrode in area.

In order to form an integrated circuit with the FETs, electrically conductive lines interconnecting sources, drains, and gates of FETs in any combination are required on the same substrate. These lines may be diffuesed or ion implanted silicon lines, deposited polysilicon or other gate electrode materials, or metallic interconnection lines such as aluminum. These interconnection line patterns can cross over and be electrically insulated from one another and, wherever desired, can be electrically connected to each other. The polysilicon and metal interconnection lines are insulated from the semiconductive substrate. Insulation between the silicon substrate and these signal lines is provided by the field isolation oxide. The polysilicon gate electrode preferably is delineated using an oxidation barrier layer. This allows an oxide to subsequently be thermally grown over the source and drain regions and on the sides of the polysilicon gate to provide partial insulation. The oxidation barrier layer is removed by etching, and an etch stopping layer is deposited over the entire structure. Then a thick oxide insulation layer is deposited. A contact hole or via is next delineated wherever desired over the polysilicon regions. This hole may be oversized due to the presence of the etch stopping layer. This greatly relieves the required degree of registration precision between the polysilicon electrode mask and the contact hole mask. Contact holes to diffused silicon regions are provided by an additional masking step. Finally a metal layer is deposited and the metallic interconnection line pattern delineated.

The present invention also relates to a method for fabricating an integrated circuit containg FETs having a self-registered electrical connection between the gate electrode and the metallic interconnection line, the gate electrode being self-aligned with respect to the source and drain regions, and wherein FETs of the integrated circuit have: a channel region; a gate insulator; electrically conductive gate electrode; source and drain regions; thick insulation over the source and drain and over the gate electrode except in the contact area; field insulation or field shield regions between FETs of the integrated circuit; metallictype high-electrical conductivity interconnection line; and self-registering electrical connection between the gate and the interconnection line. The fabrication method comprises:

A. providing a semiconductive substrate of a first conductive type containing active impurities of a first conductive type;

B. delineating and providing field oxide isolation regions between subsequently formed FETs of the integrated circuit;

C. providing a thin insulator layer on said substrate, which insulator layer is subsequently to be the FET gate insulator;

D. depositing and doping a first layer of a conductive gate electrode material above the insulator layer;

E. depositing a nonoxidizing masking layer;

F. delineating by masking and etching predetermined regions to provide FET gates and interconnection patterns of the gate electrode material;

G. forming by diffusion or ion implantation FET doped silicon source and drain regions of a second and opposite conductivity type, said source and drain regions being self-aligned with respect to the edges of the gate electrode;

H. growing a thermal oxide over the source and drain regions and on the sides of the gate to provide partial insulation;

I. removing the nonoxidizing layer by etching;

J. depositing an etch stopping layer;

K. depositing a thick layer of insulation;

L. delineating and etching open a via through said insulation layer to provide access to the gate electrode and partial access to source and drain regions;

M. removing by etching the etch stopping layer in the contact areas;

N. delineating and etching open the vias to the source and drain regions; said regions being self-aligned with respect to the edges of the gate electrode;

O. depositing and delineating a metallic-type high-electrical conductivity interconnection line pattern that makes electrical connection to the gate electrodes and to source and drain regions wherever contact holes have been provided;

P. providing an electrical connection to the semiconductive substrate.

When desired, step (I) may be combined into step (M). Furthermore, step (P) of providing an electrical connection to the semiconductive substrate can be done prior to, along with, or subsequent to forming the gate contact to the metallic interconnection line pattern. The substrate connection may be provided to the backside of the semiconductive substrate (the side opposite to that upon which the FETs are formed) or on the same side as the FETs, and that, when desired, in the latter case the metallic interconnection line pattern may also be used to make electrical connection to the desired substrate regions.

FIGS. 1, 2, 3 and 4 illustrate prior art techniques for FET fabrication which aid in the explanation of the present invention.

Referring to FIG. 1 there is shown a top view of an FET with a polysilicon gate 10 and a conventional contact hole or via 12 to the polysilicon region 14 at the side of the channel region under the gate. Such a structure is known in the art. By placing the contact hole 12 at the side of the channel, an FET of channel length, L, equal to the minimum exposable lithographic linewidth can be made. Because the contact hole is made at the side of the channel, however, additional area must be devoted to providing the metallic line 18 to gate electrode connection, and consequently the overall area of the FET is large. The polysilicon gate electrode material 14 can be extended to provide an interconnection pattern, when desired.

Figure 2:
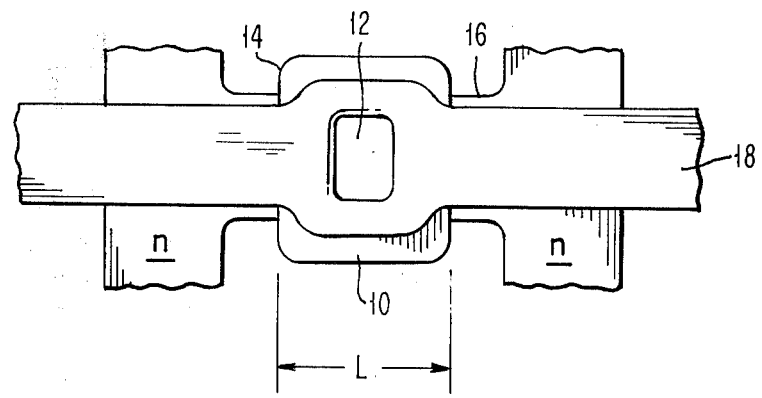
FIG. 2 shows a top view of a prior art FET with a polysilicon gate and a conventional contact hole to the polysilicon gate electrode made over the channel region of the FET.

FIG. 2 shows a top view of an FET made with the same processing steps as that of FIG. 1, but with the gate electrode connection 12 made directly over the FET channel region. This advantageously reduces the the total area devoted to the FET, but disadvantageously makes the channel length, L, long due to the required mask alignment tolerances that must be provided for the gate contact. Since the switching speed of the FET is inversely proportional to the length of the channel, it is desirable to make the smallest possible channel length with a given lithographic exposure system.

Figure 3:
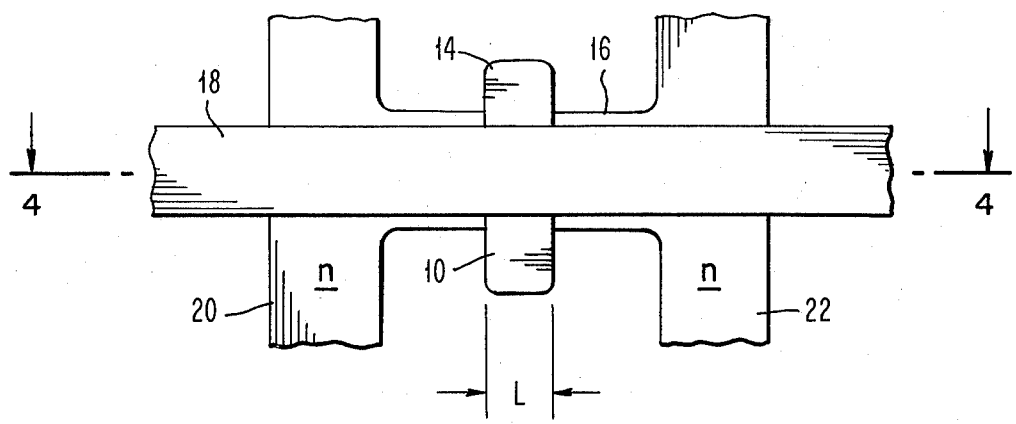
FIG. 3 shows a top view of an FET with a polysilicon gate and a self-registering gate contact made according to the prior art method of Kalter et al referred to hereinabove.
Figure 4:
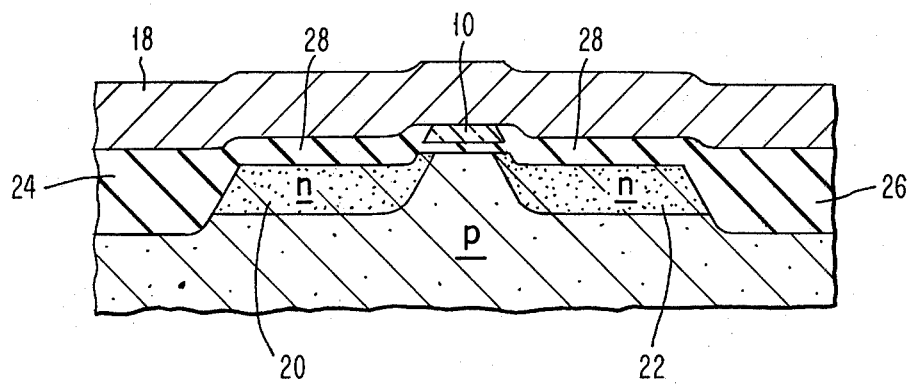
FIG. 4 shows a cross-section view of the FET of FIG. 3 along the line indicated in FIG. 3.

FIG. 3 shows a top view of an FET made with the previously mentioned self-aligned contact method of Kalter et al. Here the channel length, L, is advantageously short, and the overall FET area is small. FIG. 4 shows a cross section of the device of FIG. 3 along the line indicated. The thermally grown insulation oxide 28 over the source and drain regions 20 and 22, and over the field isolation regions 24 and 26 is limited in thickness as described earlier. In addition, because the polysilicon gate electrode material is revealed everywhere, the metallic interconnection line cannot cross over the gate material without making electrical connection. Thus, in this approach, the polysilicon gate electrode material does not provide an additional level of electrical interconnection but only provides gate electrodes.

Figure 5:
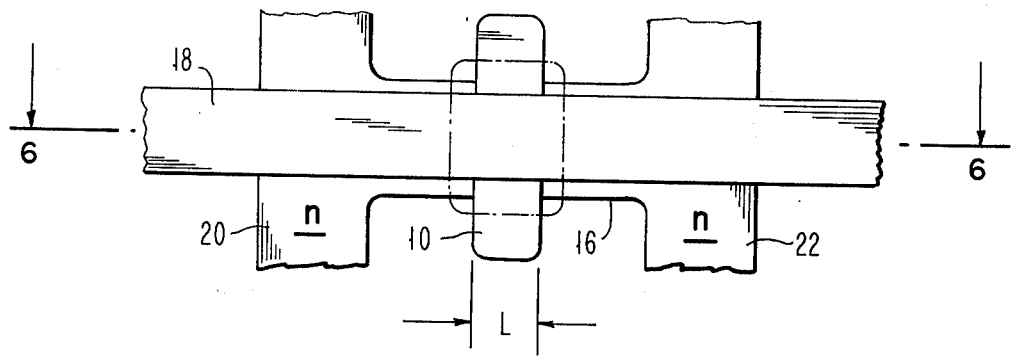
FIG. 5 shows a top view of an FET with a self-registering gate contact made according to the method of the present invention.
Figure 6:
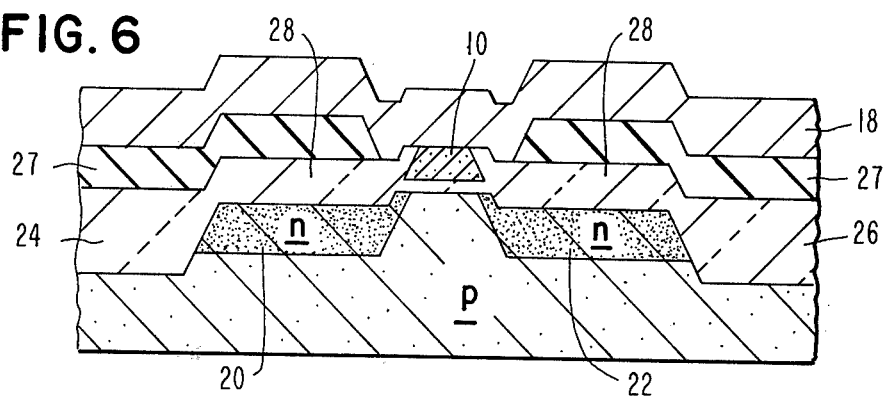
FIG. 6 shows a cross-sectional view of the FET of the present invention along the line indicated in FIG. 5.

FIG. 5 shows one embodiment of an FET with a self-registering gate contact made according to the method of the present invention. It is to be noted that the FET of FIG. 5 has the same channel length, L, and requires no more area than the FET of FIG. 3. FIG. 6 illustrates that because it is chemically vapor deposited, insulation 27 over the source region 20, drain region 22, and over the field isolation regions 24 and 26 of the FET of the present invention can be made relatively thicker than that of the known FET structure shown in FIG. 4. because it is chemically vapor deposited.

Figure 7:
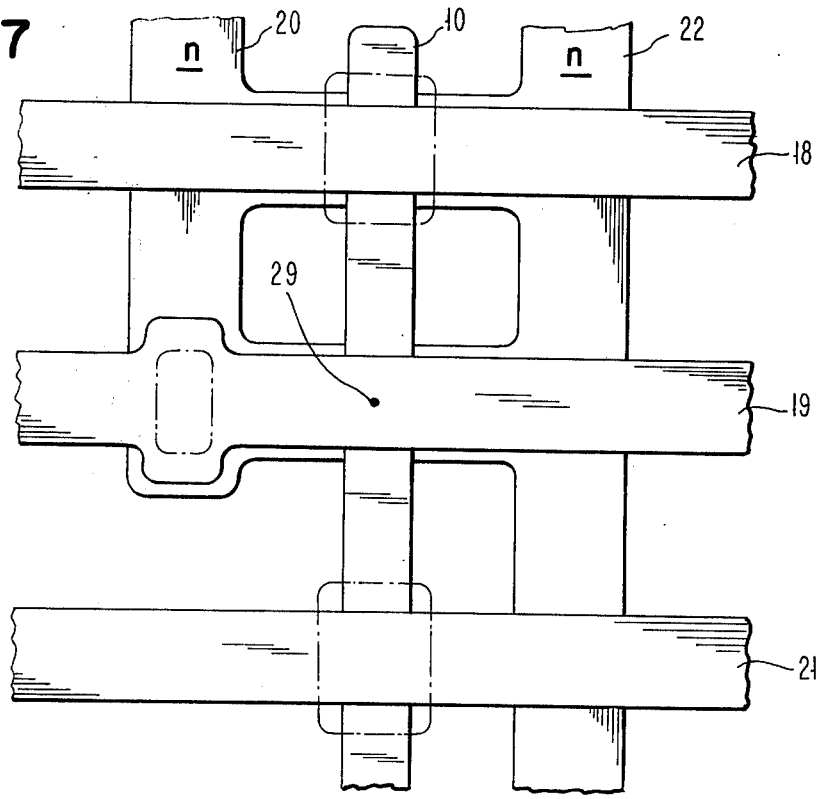
FIG. 7 shows a fragment of an FET integrated circuit made using FETs with self-registering gate contacts according to the method of the present invention.

FIG. 7 shows a fragment of an integrated circuit made with the method of the present invention. Such a fragment can be part of a random logic array. The FETs made according to the present invention allow the polysilicon gate electrode material 10 to cross under the metallic interconnection line 19 at location 29 without making electrical connection, thereby providing an additional level of electrical interconnection. Here electrical signals are carried on diffused source and drain lines 20 and 22, polysilicon gate electrode line 10, and on metallic interconnection lines 18, 19 and 21. This increases the flexibility of interconnection within the integrated circuit which leads to more compact circuit layouts and allows more complex circuits to be implemented.

For convenience, the discussion of the fabrication steps of the present invention is directed to the preferred aspect of employing a p-type silicon substrate as the semiconductive substrate and n-type impurities as the diffused or implanated dopant impurities. This leads to the n-channel FET technology. Accordingly, it is understood that an n-type substrate and p-type diffused or implanted dopant impurities can be employed according to the present invention in the p-channel FET technology.

It is understood that when the discussion refers to n-type impurities, the process steps are applicable to p-type impurities and vice versa. Also, the present invention is applicable to substrates other than silicon which are known in the art. Also, as used herein, the terms "metallic-type interconnection lines" or "high-electrical conductivity interconnection lines" refer to metal lines such as aluminum. Also, the terms "lines" and "stripes " are used interchangeably in reference to long, narrow, lithographically delineated regions. Moreover, the terms "polysilicon" and "polycrystalline silicon" are used herein interchangeably as in the prior art. Also, when reference is made to impurities of a "first type" and to impurities of the "second type", it is understood that the "first type" refers to n- or p- type impurities and "second type" refers to the opposite conductivity type. That is, if the "first type" is p, then the "second type" is n. If the "first type" is n, then the "second type" is p.

Referring to FIG. 8, there is shown a fragment of the initial structure of the invention. A p-type semiconductive silicon substrate 32 having a desired crystallographic orientation (e.g., >100<) is prepared by slicing and polishing a p-type silicon boule grown in the presence of a p-type dopant such as boron following conventional crystal growth techniques. Other p-type dopants for silicon include aluminum, gallium, and indium.

Figure 8A:
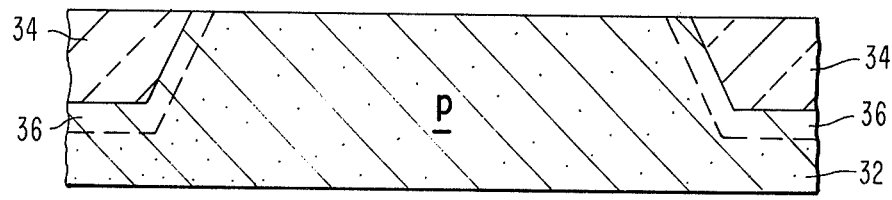
FIGS. 8A–8I are cross-sectional views along the lines indicated in FIG. 9 of the FET of the present invention in various stages of fabrication.
Figure 9A:
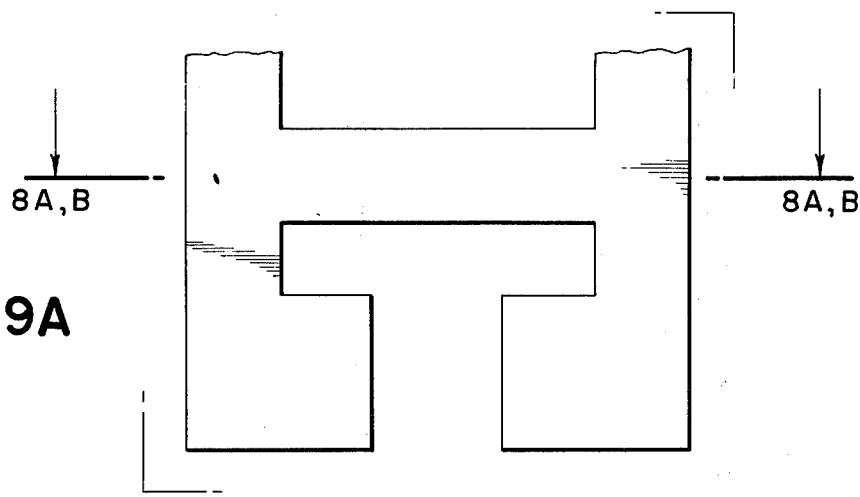
FIGS. 9A–9E show views of the five lighographic masking patterns employed according to the method of the present invention.

The first step in the process is to provide a isolation between FETs of the integrated circuit. The present invention can utilize any of several known isolation techniques; nonrecessed field oxide, recessed field oxide, deposited insulator, and field shield. For the purposes of illustration we will assume a fully recessed field isolation oxide with an ion implanted boron channel stopper region below and beside the recessed oxide as decribed for example by Dennard, Rideout, and Walker in U.S. Pat. No. 3,899,363. FIG. 8A shows the recessed field isolation oxide 34, and the channel stopper region 36 which prevents parasitic leakage channel from forming beneath and beside the field isolation oxide 34. The mask pattern shown in FIG. 9A is used to form the field isolation regions. This is the first lithographic, pattern delineating, masking step.

After formation of the field isolation regions, a thin gate insulator 38 is grown on or deposited onto the silicon substrate 32. This gate insulator, which is about 200 to 1000 A thick, is preferably of silicon dioxide and is preferably formed by thermal oxidation of the silicon surface at 1000° C in the presence of dry oxygen. Prior to or subsequent to forming the gate insulator, an additional channel surface doping may be provided by ion implanting or diffusing boron. This extra surface doping layer 40, referred to as the channel doping, is approximately 1000 to 5000 A deep and serves to increase the gate threshold voltage of the FET to a desired value. Preferably the channel doping is provided by ion implantation of boron, and preferably after forming the gate insulator. Typically, the boron implantation energy is about 50 KeV and the dosage is approximately $10^{12}$ cm$^{-2}$.

The gate electrode material 42 is then deposited. Preferably it is of polysilicon and is approximately 1500 to 5000 A thick, and may be formed by chemical vapor deposition. The polysilicon layer 42 is doped with an n-type dopant such as arsenic, phosphorus, or antimony by one of several conventional techniques. Preferably, the polysilicon is doped with phosphorus and preferably uses the technique of depositing a POCl$_3$ layer and heating it to approximately 870° C to drive the phosphorus into the polysilicon making it n-type. After this the residual of the POCl$_3$ layer is removed by etching the wafer in buffered hydrofluoric acid. A thin surface protection layer of silicon dioxide 44 about 50 to 200 A thick can then be grown on or deposited onto the polysilicon layer to prevent a subsequently deposited oxidation barrier layer 46 from reacting with the polysilicon and thereby rendering it difficult to later remove the oxidation barrier layer.

An adherent oxidation barrier layer 46 of a nonoxidizing material such as silicon nitride, aluminum nitride, boron nitride, aluminum oxide, or silicon carbide is then deposited. Preferably the layer 46 is of silicon nitride and is approximately 500 to 1000 A thick. The layer 46 may be deposited by conventional chemical-vapor deposition techniques. An additional layer of silicon dioxide 48 is then deposited. The silicon dioxide layer 48 is approximately 500 to 1000 A thick and may be formed by chemical vapor deposition.

Layer 48 serves as an etching mask to delineate the layer 46 and layer 46 serves as an etching mask to delineate predetermined geometrical patterns into the silicon dioxide layer 44 and as an oxidation barrier layer during subsequent growth of silicon dioxide over other parts of the structure. Layer 44 in turn serves as a mask to define patterns in polysilicon layer 42. The oxidation barrier layer material 46 should not oxidize or at most only oxidize extremely slowly relative to the oxidation rate of silicon and polysilicon. The oxidation barrier layer material is considered to be a nonoxidizing material under the conditions to which it is subjected in the method of the present invention. The oxidation barrier layer 46 is preferably a nitride such as silicon nitride and it prevents oxidation of the polysilicon layer 42 thereunder.

Figure 8B:
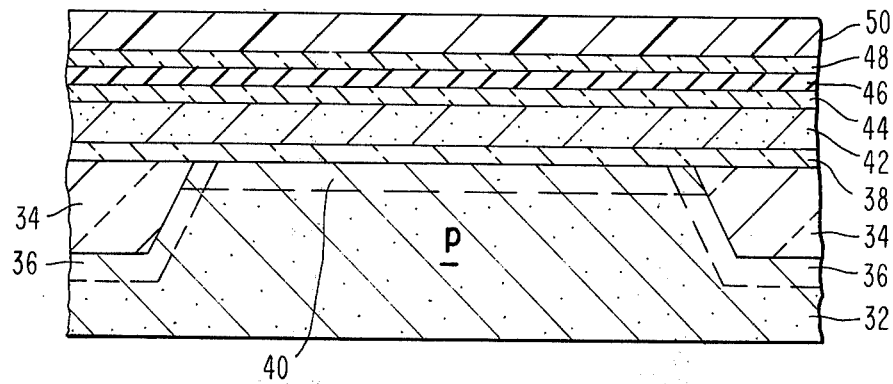

A gate electrode pattern determining layer such as a layer of resist material 50 of the type employed in known lithographic masking and etching techniques is placed over the surface of the upper silicon dioxide layer 48. Any of the well-known photosensitive polymerizable resist materials known in the art may be used. The resist material is applied as by spinning on or by spraying. The resultant structure is shown in FIG. 8B.

Figure 9B:
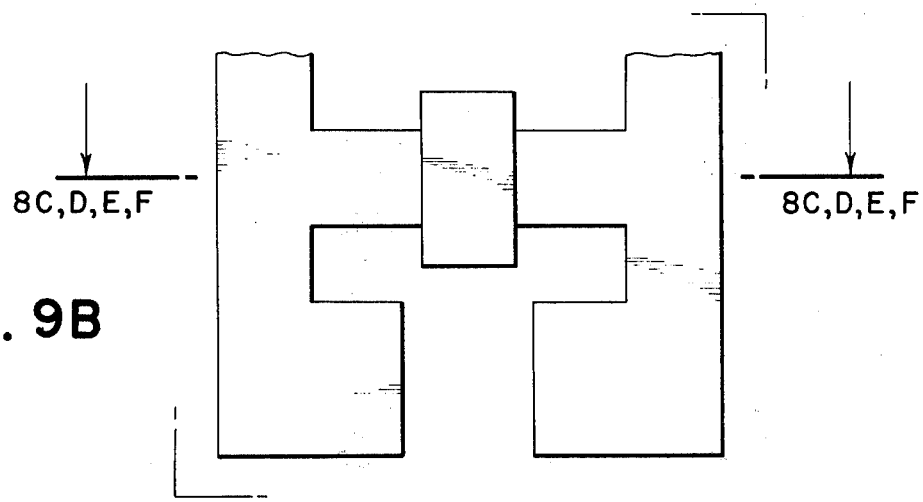

The layer of photoresist material 50 is dried and then selectively exposed to ultraviolet radiation through a photolithographic mask. This mask is of a transparent material having opaque portions in a predetermined pattern as illustrated in FIG. 9B. The masked wafer is subjected to ultraviolet light, polymerizing the portions of the resist material underlying the transparent regions of the mask. After removing the mask, the wafer is rinsed in a suitable developing solution which washes away the portions of the resist material which were under the opaque regions of the mask and thus not exposed to the ultraviolet light. The assembly may then be baked to further polymerize and harden the remaining resist material which conforms to the desired predetermined pattern, i.e., it covers the regions in which the FET devices will subsequently be formed. This is the second lithographic masking step of the process.

Figure 8C:
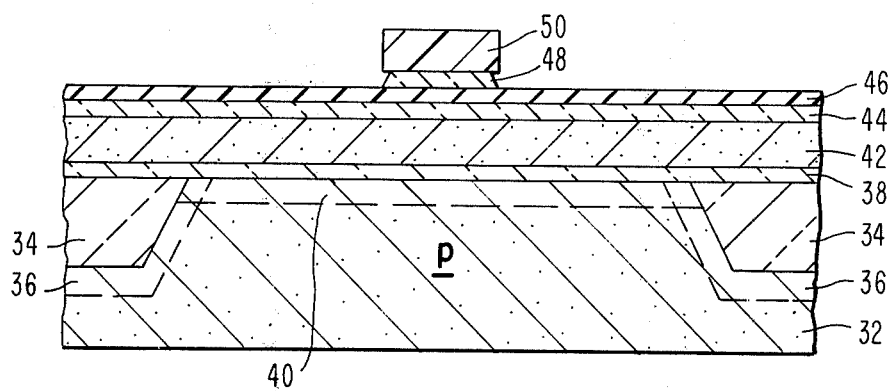

Next the structure is treated to remove the portions of the silicon dioxide 48 not protected by the resist material 50. The wafer is immersed in a solution of buffered hydrofluoric acid. The etching solution dissolves silicon dioxide but does not attack the resist, oxidation barrier layer 46 such as silicon nitride, or other materials of the assembly. The resultant structure is shown in FIG. 8C.

The photoresist material 50 above the etched regions of silicon dioxide 48 is then removed by dissolving in a suitable solvent. The remaining silicon dioxide regions in layer 48 conform to a predetermined pattern, and now serve as a mask for etching predetermined patterns in the oxidation barrier layer 46. Patterns in layer 46 then serve as a mask for etching patterns in the thin silicon dioxide layer 44, patterns in layer 44 serve as a mask for etching patterns in the polysilicon layer 42, and patterns in layer 42 serve as a mask for etching patterns in gate insulator layer 38.

Figure 8D:
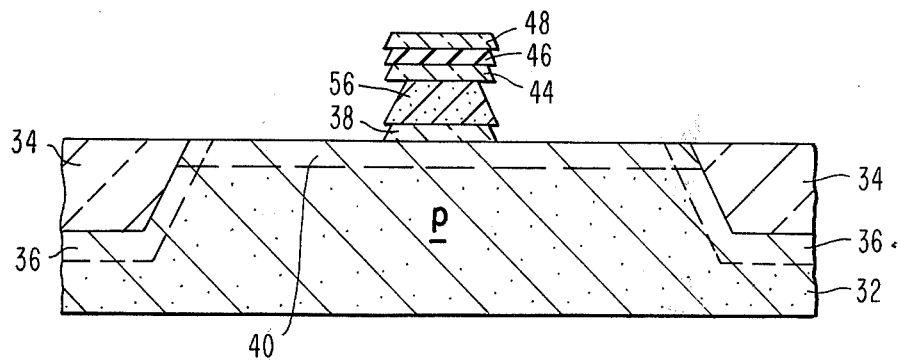

Patterns in the layer 46, when silicon nitride is employed, are formed by etching a phosphoric acid solution at 180° C. Patterns in the thin oxide layer 44 are formed by etching in a solution of buffered hydrofluoric acid. Patterns in the polysilicon layer 42 are formed by etching in an etchant such as ethylene diamine pyrocatechol at 100° C. The resultant structure is shown in FIG. 8D. Patterns in silicon dioxide gate insulator layer 38 are formed by etching in a solution of buffered hydrofluoric acid which also removes the remaining portions of oxide layer 48. This completes the second basic pattern delineating which forms the FET gate electrodes.

Figure 8E:
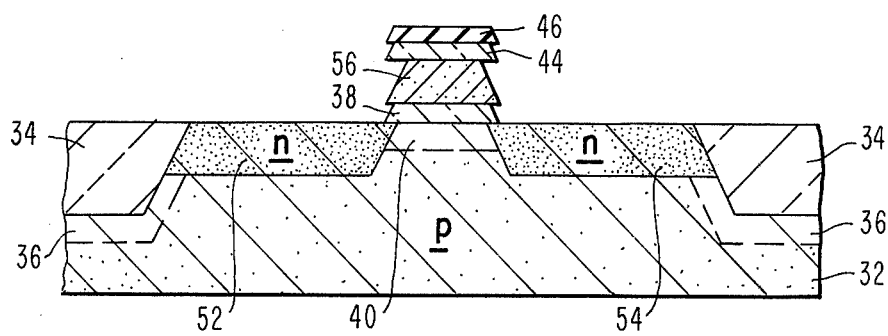

The n-type source and drain regions are now formed by well known ion implantation or diffusion techniques. For purposes of illustrating the method of the present invention, ion implantation has been selected. For instance, the n-type doped silicon source and drain regions 52 and 54, respectively, can be formed 2000 A deep by an As$^{75}$ implantation of about 100 KeV energy and $4 \times 10^{15}$ cm$^{-2}$ dosage. During the source and drain implantation, the gate insulator 38, the polysilicon gate electrode 56 and the remaining portions of the thin silicon-dioxide layer 44 and, the oxidation barrier layer 46, act as a blocking mask to prevent the implanted n-type dopant impurities from entering the FET channel region 58 under the polysilicon gate 42. The thick field isolation oxide 34 acts as a blocking mask to prevent n-type impurities from entering the parasitic channel stopper region 36. The resultant cross section after formation of the source and drain regions is shown in FIG. 8E. It is noted that when ion implantation is used to provide the n-type source and drain regions, the step of etching the exposed portions of layer 38 may be performed prior to or subsequent to the step of providing the ion implanted n-type impurities, or may be retained throughout the process as desired. Preferably the exposed portions of layer 38 are removed by etching in a solution of buffered hydrofluoric acid subsequent to performing the step of ion implanting the source and drain regions.

It is noted from FIG. 8E that the common boundaries of the n-type source 52 and drain 54, and the channel region 58 of the FET are determined by the edges of the polysilicon gate 56. This feature is generally referred to in the prior art as the "self-aligned gate technique". With the gate self-aligned with respect to the source and drain, the parasitic gate to source and drain overlap capacitances are advantageously reduced over nonself-aligned gate FET fabrication techniques.

Next, a dielectric insulation layer 60 is formed above the source and drain regions 52 and 54, respectively. Layer 60 electrically insulates the subsequently formed metallic interconnection line to the gate from the n-type source and drain regions near the gate electrode and provides additional insulation on the sides of the polysilicon gates and polysilicon interconnection regions. Formation of layer 60 also advantageously increases the thickness of the field oxide 34. Accordingly, layer 60 should be as thick as possible, but not so thick that the silicon in the source and drain regions or in the field regions is consumed during oxidation to any undesired extent.

Figure 8F:
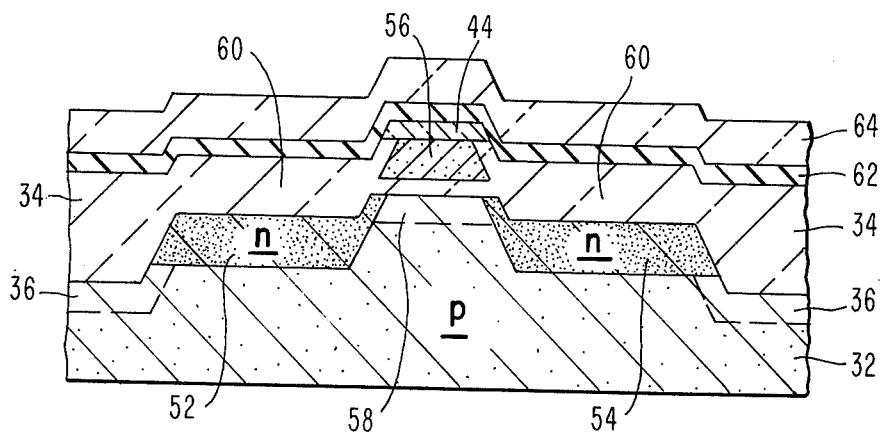

The dielectric insulation 60 over the field regions and over the n-type source and drain regions is formed by growing a silicon dioxide layer 1500 to 2500 A thick by thermal oxidation at 1000° C in the presence of steam. During this oxidation, about 600 to 1000 A of the silicon substrate over the n-type source and drain regions is converted to silicon dioxide. The n-type source and drain regions 52 and 54 are driven down into the substrate and laterally around the growing silicon dioxide as shown in FIG. 8F. Since the silicon dioxide tends to expel n-type dopants, the n-type dopant is not consumed to any significant extent during this oxidation. Also, the lateral diffusion of the n-type source and drain regions does not degrade the electrical characteristics of the FET to any significant degree. The top of the polysilicon gate is protected from oxidation by the remaining portion of oxidation barrier layer 46, whereas the ends of the gate at the source and drain boundaries are subjected to the oxidation, which desirably provides protective insulation up to the oxidation barrier layer 46. During oxidation the thickness of the field oxide 34 is advantageously increased by about 500 to 750 A. Then the remaining portions of oxidation barrier layer 46 over the polysilicon regions are removed with an etchant such as phosphoric acid at 180° C.

Now an etching barrier layer 62 is deposited over the structure. This layer is preferably 500 to 1000 A thick and preferably is deposited by chemical vapor deposition. Layer 62 is of a material that does not etch or at most etches only very slowly in the buffered hydrofluoric acid solution used to etch holes in a subsequently deposited thick layer 64 of oxide. Etching barrier layer 62 may be of aluminum oxide, aluminum nitride, silicon carbide, or silicon nitride and preferably is of silicon nitride. Layer 64 is preferably formed by chemical vapor deposition, is preferably 2500 to 5000 A thick, and is preferably of silicon dioxide. Layer 64 is deposited over the entire structure including over the polysilicon gate electrode regions 56. The resultant structure is shown in FIG. 8F.

Figure 9C:
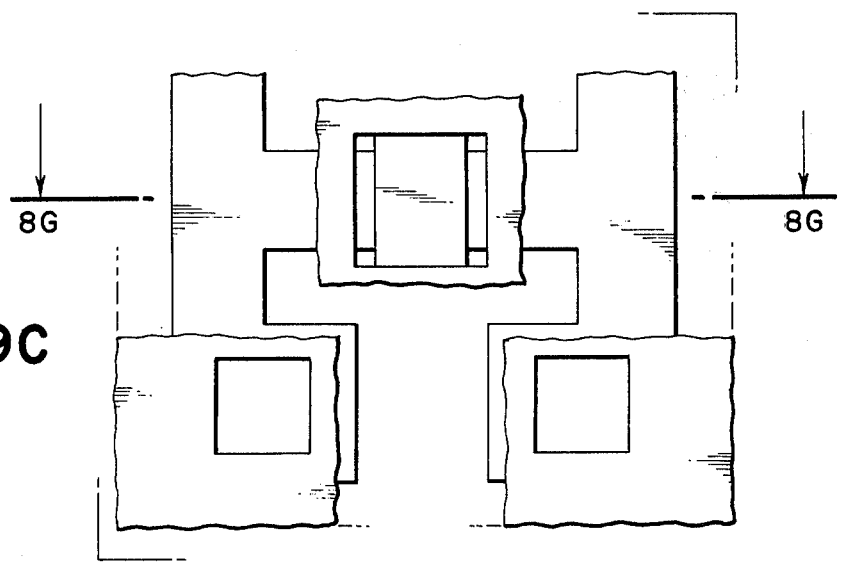

Again a layer of photoresist is applied and then selectively exposed to ultraviolet radiation through a photolithographic mask. This mask is of a transparent material having opaque portions in a predetermined pattern as illustrated in FIG. 9C. The masked wafer is subjected to ultraviolet light, polymerizing the portions of the resist material underlying the transparent regions of the mask. After removing the mask, the wafer is rinsed in a suitable developing solution which washes away the portions of the resist material not exposed to the ultraviolet light. The assembly may then be baked to further polymerize and harden the remaining resist material which conforms to the desired predetermined pattern, i.e., it covers the regions in which contact holes will not subsequently by etched. This is the third lithographic masking step. These etched regions will eventually provide the contact holes or vias to the polysilicon gate electrode, and to n-type silicon source and drain regions.

Figure 8G:
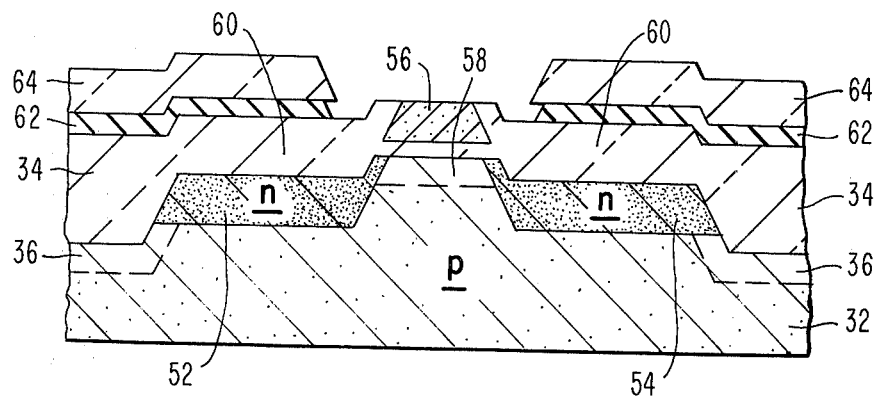

Now the structure is etched in a buffered hydrofluoric acid solution to remove the portions of the oxide layer 64 not protected by the resist material. The depth of the etched contact hole thus far is determined by the etching barrier layer 62 which does not dissolve significantly in the buffered hydrofluoric acid solution. Remaining portions of photoresist are now dissolved in a suitable solvent. Then the exposed portions of the etching barrier layer 62 of silicon nitride in the via openings are removed by etching in phosphoric acid at 180° C. The exposed portions of thin oxide layer 44 in the contact hole over the polysilicon gate electrode is now removed by a short time or "dip" etch in a buffered hydrofluoric acid solution. Etching of thin oxide layer 44 does not significantly reduce the thickness of thermal oxide layer 60 in the contact hole areas or of other oxide layers of the structure. At this stage in the process the polysilicon gate electrode in the contact hole region is completely revealed as shown in FIG. 8G. The step of dip etching exposed portions of thin oxide layer 44 may be performed at a later stage in the process; for example just prior to deposition of a metallic interconnection line layer.

From FIG. 8G the purpose of thermal oxide insulation layer 60 should now be evident for without it the metallic layer contacting the gate would be electrically shorted to the FET source and drain regions.

While the method of the present invention is greatly facilitated by the use of the etch stopping layer 62, the process can be practiced without layer 62 if considerable care is exercised during the etching of the oxide insulation. As shown in FIG. 8F, the insulation over the polysilicon gate material 56 is provided by deposited oxide layer 64, while the insulation over the doped silicon source and drain regions 52 and 54 includes both deposited oxide layer 64 and thermally grown oxide 60. Because of this difference in oxide insulation thickness, and advantageously utilizing the relatively faster etching rate of deposited oxide, one can etch down to the polysilicon region without revealing the source and drain regions by careful monitoring of the etching time.

Figure 9D:
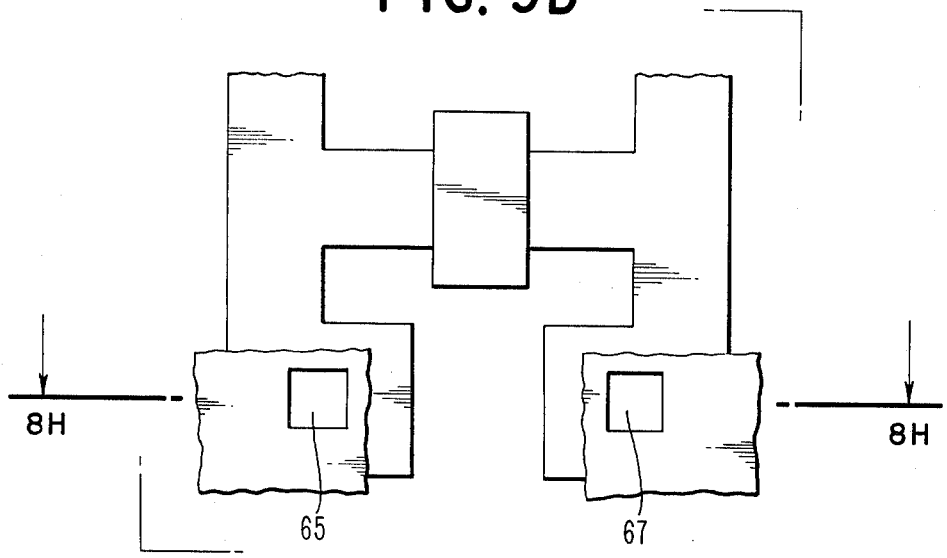

At this stage in the process, the contact holes or vias 65 and 67 over the n-type source and drain regions do yet extend through thermal oxide layer 60. Another layer of photoresist is applied, exposed, and developed as described hereinabove. The reminaing resist conforms to the pattern illustrated in FIG. 9D, i.e., it covers the regions in which contact holes to n-type source and drain regions will not be etched. This is the fourth lithographic pattern delineating step.

Figure 8H:
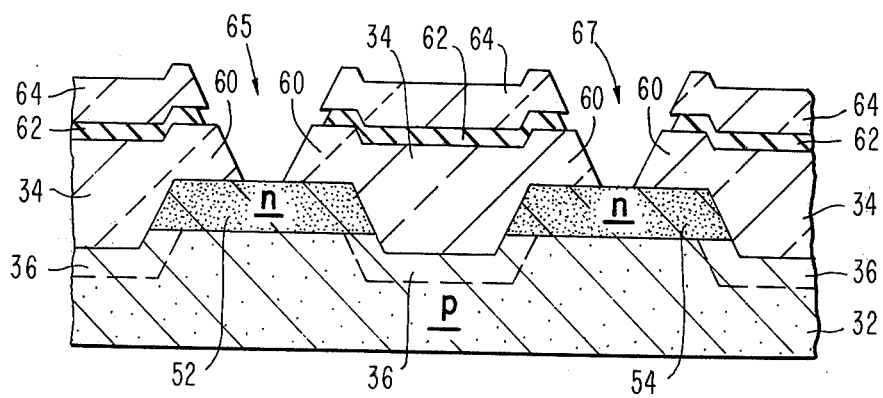

Exposed portions of thermal oxide layer 60 in the contact holes are removed by etching in a buffered hydrofluoric acid solution to reveal the n-type silicon source and drain regions. Then the remaining resist regions are dissolved in a suitable solvent. The cross section of the structure including the contact holes to the n-type source and drain regions is shown in FIG. 8H.

Figure 8I:
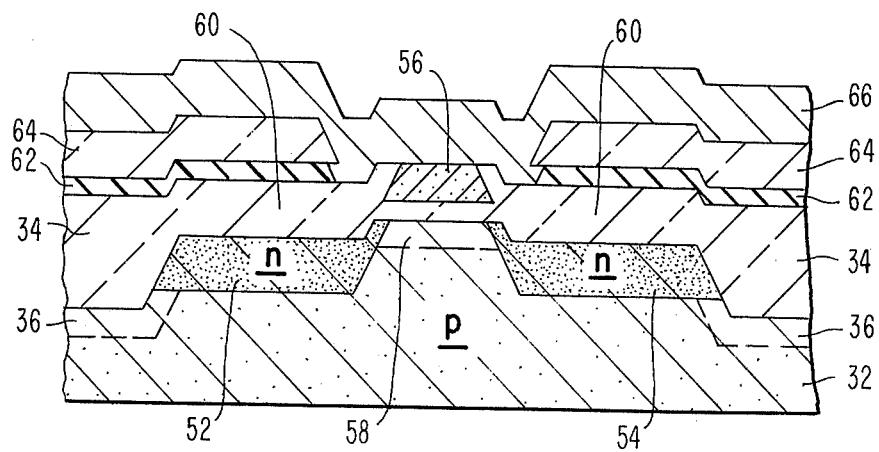
Figure 9E:
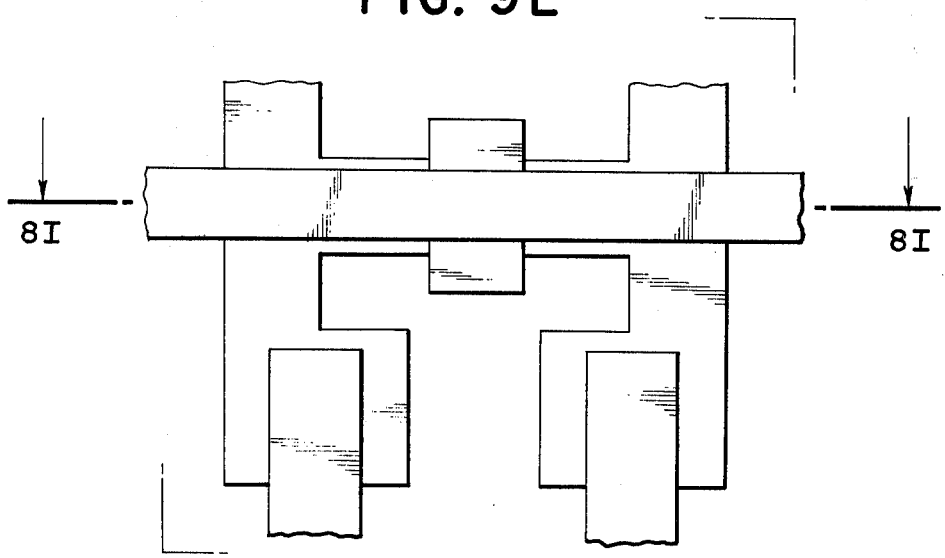

A layer 66 of a high-electrical conductivity material such as aluminum is now deposited. Preferably the aluminum layer is 5000 to 10,000 A thick and is deposited by evaporation. A layer of photoresist is applied, exposed, and developed used the pattern shown in FIG. 9E. Then the metallic interconnection line pattern is delineated by etching, and the remaining portions of resist are dissolved in a suitable solvent. This is the fifth pattern delineating step. A cross section of the structure of the self-registering FET gate connection is shown in FIG. 8I. It is noted that the oxide insulation layer is relatively much thicker over most of the source region 52 and drain region 54 as well as over the field isolation region 34 due to the presence of the deposited oxide layer 64. This advantageously reduces the cross coupling capcitance between the source, drain, and substrate regions and the metal line connecting to the polysilicon gate electrode.

As is known to those skilled in the state of the art, other layers such as a sputtered quartz passivation layer may be provided. Furthermore, additional masking steps may be performed to provide vias through this passivation layer to access the metallic interconnection pattern. In addition, electrical connection to either side of the semiconductive substrate may be provided by additional metallic layers.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of fabricating a field effect transistor (FET) having self-registering electrical connections between the gate electrode and metallic interconnection line thereof comprising the steps of:
    A. providing a semiconductive substrate of a first conductive type containing active impurities of a first conductive type;
    B. providing an FET gate insulator on said substrate;
    C. depositing and doping a layer of a conductive gate electrode material above said gate insulator;
    D. deposition a nonoxidizing masking layer;
    E. delineating by masking and etching predetermined regions to provide FET gate and interconnection patterns of the gate electrode material;
    F. forming by diffusion or ion implantation FET doped silicon source and drain regions of second conductivity type opposite to first conductivity type of said substrate, the boundaries of said source and drain regions being determined by the edges of said predetermined gate patterns provided in step (E) so that said source and drain regions are self-aligned with respect to the edges of said gate electrode;
    G. forming a dielectric insulation layer over said source and drain regions and on the sides of said gate;
    H. removing the nonoxidizing layer by etching;
    I. deposition a thick layer of insulation;
    J. delineating and etching predetermined access holes through said thick insulation layer over said gate electrode and over said source and drain regions;
    K. delineating and etching open contact holes to the source and drain regions;
    L. depositing and delineating a predetermined, metallic-type, high-electrical conductivity, interconnection line pattern that makes electrical connection to the gate electrodes and to source and drain regions.

2. The method of claim 1 wherein said FET is adapted to be connected in an integrated circuit further including a step intermediate step (A) and (B) of delineating and providing field oxide isolation regions above or recessed into the substrate to provide insulation between FETs in said integrated circuit.

3. The method of claim 1 which includes the step of depositing an etch stopping layer to determine the depth of the access holes after step (H) but before step (I), and the step of removing by etching said etch stopping layer in the access hole areas over said gate electrode and over siad source and drain regions after step (J) but before step (K).

4. The method of claim 1 which includes the step of providing an electrical connection to the semiconductive substrate.

5. The method of claim 2, wherein said insulating field oxide regions are of silicon dioxide.

6. A method of claim 1, wherein said semiconductive substrate is a p-type silicon substrate containing active p-type impurities.

7. The method of claim 6, wherein said p-type impurities are selected from the group consisting of boron, aluminum, gallium and indium.

8. The method of claim 1, wherein said FET gate insulator is a layer of silicon dioxide about 200 to about 1000 A in thickness.

9. The method of claim 1, wherein said conductive gate electrode material is a polysilicon layer about 1500 to about 5000 A in thickness and is doped with an n-type dopant of arsenic, phosphorus or antimony.

10. The method of claim 1, wherein said nonoxidizing masking layer is of silicon nitride and is about 500 to about 1000 A in thickness and is covered by a silicon dioxide layer about 500 to about 1000 A in thickness.

11. The method of claim 1, wherein step (E) includes placing a layer of photoresist material over said nonoxidizing masking layer of step (D), selectively exposing said photoresist layer to radiation through a selected mask, removing the portions of the photoresist layer which were not exposed to the radiation, removing by etching the portions of the nonoxidizing masking layer of step (D) not protected by the photoresist material and then removing the remaining photoresist material above the etched regions of the nonoxidizing masking layer.

12. The method of claim 1, wherein said source and drain regions are formed of n-type impurities.

13. The method of claim 1, wherein ion implantation of said source and drain regions includes forming n- type doped source and drain regions about 2000 A deep by an As$^{75}$ implantation of about 100 KeV energy and $4\times10^{15}$ cm$^{-2}$ dosage.

14. The method of claim 1 wherein said dielectric insulation over said source and drain regions and on the sides of the gate is a layer of silicon dioxide about 1500 to about 2500 A in thickness formed by thermal oxidation at about 1000° C in the presence of steam, wherein a portion of said semiconductive substrate material over the source and drain regions is converted to silicon dioxide, and wherein the source and drain regions are driven down into the substrate and laterally around said silicon dioxide.

15. The method of claim 1, wherein the etch stopping layer is formed by chemical vapor deposition, is about 500 to about 1000 A in thickness, and is of silicon nitride, aluminum oxide, aluminum nitride or silicon carbide.

16. The method of claim 1, wherein the thick layer of insulation is formed by chemical vapor deposition, is about 2500 to about 5000 A in thickness, and is of silicon dioxide.

17. The method of claim 1, wherein the opening of an access hole through the thick insulation layer includes applying a layer of photoresistive material on said thick layer and exposing the photoresistive material to radiation through a predetermined mask and removing the unexposed portions of the photoresistive material.

18. The method of claim 1 wherein access holes in the thick oxide insulation layer are provided by etching in a buffered hydrofluoric acid solution.

19. The method of claim 3 wherein said etch stopping layer is a layer of silicon nitride aluminum nitride, aluminum oxide, or silicon carbide; is preferably of silicon nitride; is about 500 to 1000 A in thickness; and is formed by chemical vapor deposition.

20. The method of claim 3, wherein the uncovered portions of the etch stopping layer in the access holes are removed by etching in phosphoric acid at a temperature of about 180° C.

21. The method of claim 1, wherein the opening of contact holes to the source and drain regions is provided by an etching in a buffered hydrofluoric acid solution.

22. The method of claim 1, wherein a metallic-type high-electrical conductivity line interconnection line pattern is formed by depositing a layer of high-electrical conductivity metal by evaporation; applying, exposing and developing a photoresist pattern over the metal layer; and etching the metallic line pattern.

23. A method of making an integrated circuit structure including an array of interconnected FET devices having self-registering electrical connections between the gate electrode and metallic interconnection line thereof wherein said FET devices are fabricated by a process comprising the steps of:
A. providing a semiconductive substrate of a first conductive type containing active impurities of a first conductive type and delineating and providing field oxide isolation regions above or recessed into the substrate to insulate between FETs in said integrated circuit;
B. delineating and providing field oxide isolation regions above or recessed into the substrate to provide insulation between FETs of the integrated circuit;
C. providing an FET gate insulator on said substrate;
D. depositing and doping a layer of a conductive gate electrode material above said gate insulator;
E. depositing a nonoxidizing masking layer;
F. delineating by masking and etching predetermined regions to provide FET gate and interconnection patterns of the gate electrode material;
G. forming by diffusion or ion implantation FET doped silicon source and drain regions of second conductivity type opposite to first conductivity type of said substrate, the boundaries of said source and drain regions being determined by the edges of said predetermined gate patterns provided in step (F) so that said source and drain regions are self-aligned with respect to the edges of said gate electrode;
H. forming a dielectric insulation layer over said source and drain regins and on the sides of said gate;
I. removing the nonoxidizing layer by etching;
J. depositing a thick layer of insulation;
K. delineating and etching predetermined access holes through said thick insulation layer over said gate electrode and over said source and drain regions;
L. delineating and etching open contact holes to the source and drain regions;
M. depositing and delineating a predetermined, metallic-type, high-electrical conductivity, interconnection line pattern that makes electrical connection to the gate electrodes and to source and drain regions.

24. The method of claim 23 which includes the step of depositing an etch stopping layer to determine the depth of the access holes after step (I) but before step (J), and the step of removing by etching said etch stopping layer in the access hole areas over said gate electrode and over said source and drain regions after step (K) but before step (L).

25. The method of claim 24 includes the step of providing an electrical connection to the semiconductive substrate.

* * * * *

UNITED STATES PATENT AND TRADEMARK OFFICE
CERTIFICATE OF CORRECTION

PATENT NO. : 4,035,198

DATED : July 12, 1977

INVENTOR(S) : Dennard et al

It is certified that error appears in the above-identified patent and that said Letters Patent are hereby corrected as shown below:

Column 5, line 7, "show views" should read --show top views--.
Column 13, line 58, "deposition" should read --depositing--.
Column 14, line 7, "deposition" should read --depositing--.
Column 16, line 30, "regins" should read --regions--.
Column 16, line 52, "claim 24 includes" should read --claim 24 which includes--.

Signed and Sealed this

Twenty-sixth Day of February 1980

[SEAL]

Attest:

SIDNEY A. DIAMOND

Attesting Officer     Commissioner of Patents and Trademarks